(12) United States Patent
Sewell et al.

(10) Patent No.: US 8,339,571 B2
(45) Date of Patent: Dec. 25, 2012

(54) LITHOGRAPHIC METHOD AND APPARATUS

(75) Inventors: Harry Sewell, Ridgefield, CT (US);
Jozef Petrus Henricus Benschop,
Veldhoven (NL)

(73) Assignees: ASML Netherlands B.V., Veldhoven
(NL); ASML Holdings NV, Veldhoven
(NL)

( * ) Notice: Subject to any disclaimer, the term of this patent is extended or adjusted under 35 U.S.C. 154(b) by 1029 days.

(21) Appl. No.: 12/314,612

(22) Filed: Dec. 12, 2008

(65) Prior Publication Data
US 2009/0153826 A1 Jun. 18, 2009

Related U.S. Application Data

(60) Provisional application No. 61/006,065, filed on Dec. 17, 2007.

(51) Int. Cl.
G03B 27/42 (2006.01)
G03B 27/32 (2006.01)

(52) U.S. Cl. ............................. 355/53; 355/77
(58) Field of Classification Search .................. 355/53, 355/77; 430/311
See application file for complete search history.

(56) References Cited

U.S. PATENT DOCUMENTS

| 6,611,316 B2 | 8/2003 | Sewell |
| 7,256,873 B2 | 8/2007 | Finders et al. |
| 2002/0123012 A1 | 9/2002 | Sewell |
| 2004/0027553 A1* | 2/2004 | Henke et al. ................ 355/77 |
| 2005/0162627 A1 | 7/2005 | Finders et al. |
| 2007/0054493 A1 | 3/2007 | Nam |
| 2007/0212648 A1 | 9/2007 | Lalbahadoersing et al. |
| 2007/0212649 A1 | 9/2007 | Lalbahadoersing et al. |
| 2007/0242249 A1 | 10/2007 | Shibazaki et al. |

FOREIGN PATENT DOCUMENTS

| JP | 10-097738 | 4/1998 |
| JP | 2000-021031 | 1/2000 |
| JP | 2004-519850 T | 7/2004 |
| JP | 2005-223321 | 8/2005 |
| KR | 2007-0092130 | 9/2007 |
| WO | WO 2006/045332 A1 | 5/2006 |

OTHER PUBLICATIONS

Korean Office Action dated Jan. 3, 2011 in corresponding Korean patent application No. 10-2008-0128056.
Byers J et al.: "Double Exposure Materials: Simulation Study of Feasibility", Journal of Photopolymer Science and Technology, vol. 20, No. 5, Sep. 18, 2007, pp. 707-717.
Search Report dated Apr. 14, 2009 for European Patent Application No. 08253937.
European Office Action dated May 16, 2012 in corresponding European Patent Application No. 08 253 937.0.
Japanese Office Action mailed Jun. 19, 2012 in corresponding Japanese Patent Application No. 2008-313796.

* cited by examiner

*Primary Examiner* — Peter B Kim
(74) *Attorney, Agent, or Firm* — Pillsbury Winthrop Shaw Pittman LLP

(57) ABSTRACT

A multiple patterning process employs a phase change material, portions of which can be converted to an amorphous state and then a remaining portion is selectively removed to provide high resolution pattern features with a feature spacing smaller than, for example, a minimum spacing available in a conventional patterning layer employing a single exposure. A lithographic apparatus for use in the process may comprise an exposure tool having a single illuminator and single patterning device that is imaged through a single exposure slit onto a scanning substrate. Alternatively, the exposure tool may have multiple illuminators and/or multiple scanning complementary patterning devices optionally used with multiple exposure slits on the scanning substrate to facilitate double patterning in a single substrate pass.

38 Claims, 6 Drawing Sheets

LITHOGRAPHIC METHOD AND APPARATUS

This application claims priority and benefit under 35 U.S.C. §119(e) to U.S. Provisional Patent Application No. 61/006,065, entitled "LITHOGRAPHIC METHOD AND APPARATUS", filed on Dec. 17, 2007. The content of that application is incorporated herein in its entirety by reference.

FIELD

The present invention relates to a method for pattern transfer, lithographic apparatus suitable for use in such a method, and a device manufacturing method.

BACKGROUND

A lithographic apparatus is a machine that applies a desired pattern onto a target portion of a substrate. Lithographic apparatus can be used, for example, in the manufacture of integrated circuits (ICs). In that instance, a pattern provided by a patterning device (e.g., a reticle pattern), may be used to generate a circuit pattern to be formed on an individual layer of the IC. The circuit pattern can be transferred onto a target portion (e.g. comprising part of a die, one die or several dies) on a substrate (e.g. a silicon wafer). Transfer of the circuit pattern is typically via imaging of the pattern onto a layer of radiation-sensitive material (e.g., photo-activated resist or photoresist) provided on the substrate, using a projection system. A beam of radiation is patterned by having that beam traverse the patterning device, and is projected by the projection system onto the target portion on the substrate, such as to image the desired pattern in the resist. A lithographic printing process further includes a development of the resist layer after exposure such as to generate printed features, which may be features of resist material, or spaces in resist material. The resist material may serve as an etch mask for an underlying layer to be patterned by etching.

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

There is a continuing desire to be able to generate patterns with finer resolution. In general, shorter wavelength radiation may be used in order to achieve a finer resolution pattern. Step and scan systems are becoming resolution limited, particularly using radiation having 193 nm wavelength. Resolution has been extended using immersion lithography which allows a numerical aperture increase to approximately 1.56 NA. This will support 32 nm (half pitch) resolution. To go to higher resolution, particularly using 193 nm wavelength illumination, will require the development of new patterning techniques.

A patterning technique that has been developed to try to afford etching of smaller features employs the use of a hard mask provided in between a substrate layer that is to be patterned and a layer of resist. The hard mask is more resistant than the resist material to the etching conditions required to transfer the intended pattern into the underlying substrate, which therefore avoids problems associated with the resist being etched at a faster rate than the substrate during pattern transfer. In spite of the development of such methods employing hard masks, limitations on the minimum size of features that can be etched into a substrate are imposed by, for example, the wavelength of radiation used for the pattern imaging. Based on lithography tool parameters such as numerical aperture, a minimum pitch at which adjacent features can be printed on a substrate ("minimum feature pitch") is limited for a given wavelength of radiation used. The minimum pitch used in lithography reticles (taking into account the demagnification from the reticle to the substrate) is generally selected according to the minimum feature pitch printable using the lithography tool employing the reticle, since any reticle features arranged at corresponding smaller pitches would not print out on the substrate. Thus, for a given lithography apparatus, a reticle or set of reticles used to produce a given patterned beam of radiation, is typically configured with reticle features that are designed to produce structures in a substrate that have a feature pitch equal to or larger than the minimum feature pitch printable by the lithography apparatus.

In view of the above limitations, as the required separation (minimum feature pitch required) between features shrinks in advanced electronic technologies, it becomes increasingly difficult to fabricate a device using conventional single exposure processes, in which a substrate is exposed to a patterned beam of radiation in a single exposure. For example, for sub-90 nm device size, it is increasingly difficult to pattern features using 248 or 193 nm radiation. In order to increase the amount of structures on a substrate, so that structures can be spaced at a distance below the minimum feature pitch associated with a lithography tool used to pattern the substrate, double exposure techniques have been developed.

In one example of a current double exposure dual trench printing process, a layer of resist overlaying a layer of hard mask material deposited on a substrate is exposed to a first dose of patterned radiation constituting an image of a reticle pattern. Exposed regions of the resist are then removed, followed by a hard mask etch step, to form a first series of spaces in the hard mask. A further layer of resist is then provided to coat the layer of hard mask material, followed by displacement of the patterning reticle by a predetermined distance. Subsequent patterning and etching of respectively the resist layer and the hard mask layer to provide a second series of spaces results in new spaces disposed in interleaved positions between the first series of spaces. Residual resist is then selectively removed leaving the patterned hard mask with both the first and second series of spaces formed therein. The pattern defined by the hard mask can then be etched into the underlying substrate. In this way, a reticle configured to produce a feature pitch D in a single exposure, can be used to pattern and form a hard mask and thereby a substrate, with a feature pitch less than D, for example D/2.

SUMMARY

It will be appreciated, however, that the process described above requires two separate resist layer depositions, two resist exposure steps and two hard mask etching steps. A problem that may be encountered during the development of enhanced resolution double patterning techniques is associated with the physical and/or chemical properties of the resist and how such properties are affected by exposure to a first dose of patterned radiation prior to exposure to a second dose of patterned radiation. Regions of the resist adjacent to areas that have been exposed to a first dose of radiation may be affected by the first dose of radiation such that those areas retain a 'memory' of that first dose, which could be detrimental to the patterning accuracy of a subsequent second dose of radiation. By way of example, in a resist incorporating a photo acid generator, acid may be generated by the photo acid generator in areas adjacent to exposed areas even though the adjacent areas have been exposed to radiation below the threshold dose to form the pattern features. In light of the above, for example, a need exists for an improved multiple patterning technique.

According to an aspect of the invention, there is provided a method for pattern transfer, comprising:

exposing a first portion of a phase change material layer provided on a substrate to a first dose of radiation sufficient to convert the first portion to an amorphous state;

exposing a second portion of the phase change material layer, separate from the first portion, to a second dose of radiation sufficient to convert the second portion to an amorphous state; and removing a portion of the phase change material layer other than the first and second portions such that the first and second portions are substantially intact and define a pattern.

A further aspect of the present invention provides a lithographic apparatus, comprising:

a substrate holder configured to hold a substrate provided with a layer of phase change material;

an exposure apparatus configured to expose a first portion of the phase change material layer to a first dose of radiation sufficient to convert the first portion to an amorphous state, and configured to expose a second portion of the phase change material layer, separate from the first portion, to a second dose of radiation sufficient to convert the second portion to an amorphous state; and an etching apparatus configured to remove a portion of the phase change material layer other than the first and second portions such that the first and second portions are substantially intact and define a pattern.

Another aspect of the present invention provides a device manufacturing method, comprising:

exposing a first portion of a phase change material layer provided on a substrate to a first dose of radiation sufficient to convert the first portion to an amorphous state;

exposing a second portion of the phase change material layer, separate from the first portion, to a second dose of radiation sufficient to convert the second portion to an amorphous state;

removing a portion of the phase change material layer other than the first and second portions such that the first and second portions are substantially intact and define the pattern; and transferring the pattern into the substrate.

In a further aspect of the present invention there is provided a carrier medium carrying computer readable instructions arranged to cause a lithographic apparatus to carry out a method comprising:

exposing a first portion of a phase change material layer provided on a substrate to a first dose of radiation sufficient to convert the first portion to an amorphous state;

exposing a second portion of the phase change material layer, separate from the first portion, to a second dose of radiation sufficient to convert the second portion to an amorphous state; and removing a portion of the phase change material layer other than the first and second portions such that the first and second portions are substantially intact and define the pattern.

In an embodiment, a phase change material is employed that can be selectively and rapidly heated and then cooled to define patterned regions within the material accurately. The patterned regions can be selectively developed to form a high resolution pattern, which may then be transferred to an underlying layer, such as a substrate or further device processing layer, e.g. a layer of resist. A phase change material is employed since conversion to an amorphous state involves a dose of radiation in excess of a well-defined threshold level which is dependent upon the particular phase change material chosen. Only the area of the phase change material which is exposed to radiation in excess of the threshold level will convert to an amorphous state and so a region adjacent to the intended patterned area which is exposed to less than the threshold level of radiation does not convert to an amorphous state and so retains substantially no 'memory' of a previous exposure.

In an embodiment, a thin crystalline film of phase change material is employed to enable a resolution enhancing multiple pattern technique.

The exposure apparatus may be a dry projection system lithographic apparatus or an immersion lithography tool using, for example water or a high-refractive index liquid as the immersion fluid. The exposure tool may have a single illuminator and single patterning device that is imaged through a single exposure slit onto a scanning substrate. Alternatively, the exposure tool may have multiple illuminators and/or multiple scanning complementary patterning devices optionally used with multiple exposure slits on the scanning substrate, such as first and second slits 100, 102 as shown in FIG. 1 when viewed via a projection system pupil 104, to facilitate multiple patterning in a single substrate pass.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 2A:
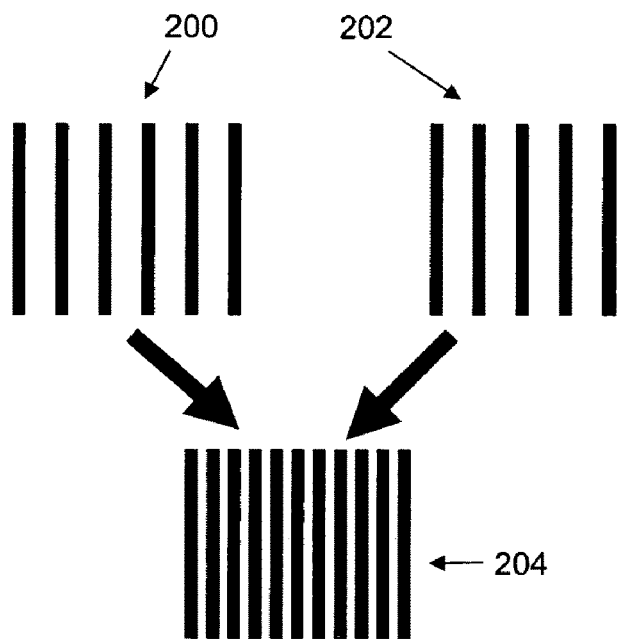
FIG. 2a is a diagram used to explain a double exposure principle of double patterning lithography employed in an embodiment of the present invention.
Figure 2B:
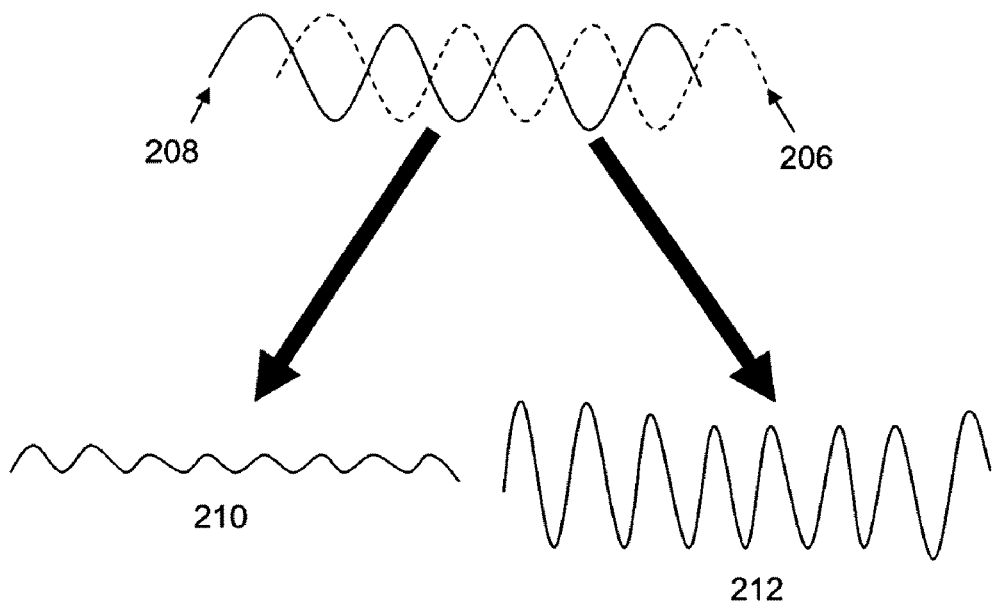
FIG. 2b is a diagram used to explain a double exposure principle of double patterning lithography with and without using a phase change material layer according to an embodiment of the present invention.

With reference to FIG. 2a, the double patterning lithography technique is based on the principle that the exposure of two separate interleaving patterns 200, 202, when combined to form a single pattern 204, effectively doubles the patterning resolution. As illustrated in FIG. 2b, when a first and second image 206, 208 is applied to a conventional patterning material, such as a standard photoresist, the material retains a 'memory' of the first image 206 in areas adjacent to but not forming part of the first image 206 (any such area is also referred to as a proximity tail of an aerial image). As a result, after application of the second image 208 the contrast of the intended final image 210 is unsatisfactorily low.

An embodiment of the present invention provides a method for pattern transfer, comprising: exposing a first portion of a phase change material layer provided on a substrate to a first dose of radiation sufficient to convert the first portion to an amorphous state; exposing a second portion of the phase change material layer, separate from the first portion, to a second dose of radiation sufficient to convert the second portion to an amorphous state; and removing a portion of the phase change material layer other than the first and second portions such that the first and second portions are substantially intact and define the pattern. With reference to FIG. 2b, in the method of an embodiment of the present invention wherein a phase change patterning material is employed, only the regions of the phase change material which have been exposed to radiation above a threshold level of radiation required to convert the material into an amorphous state, by a local heating and a subsequent cooling of the phase change material, become soluble in developer. After the cooling the phase change material has essentially 'forgotten' any partial exposure resulting from the proximity tail of the aerial image associated with any of the two exposures. So the final pattern image 212 possesses a desired contrast to provide resolution doubling.

In an embodiment, typical feature sizes can be 16 nm for exposed lines (negative patterning material) on a 64 nm pitch for each separate pattern, thereby providing a final pattern of 16 nm on a 32 nm pitch after the second exposure, that is 16 nm (half pitch) node lithography.

Figure 1:
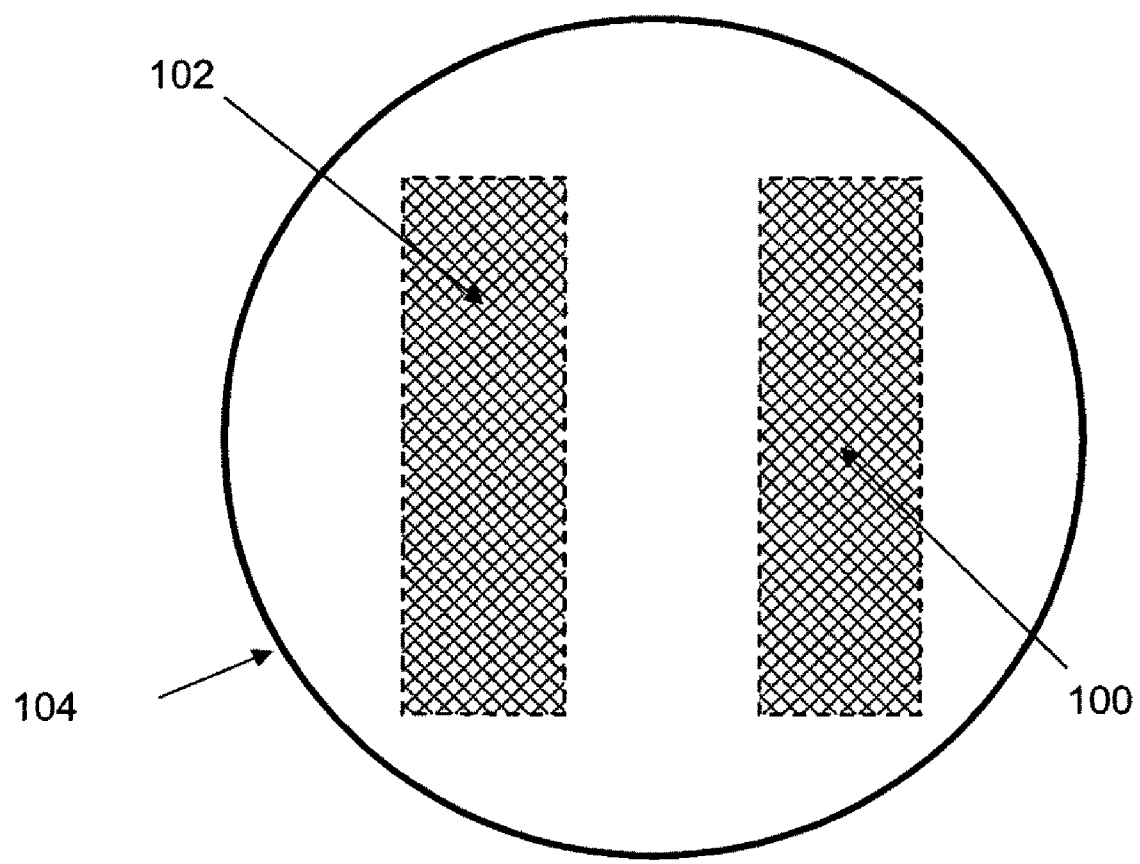
FIG. 1 is a schematic representation of a projection system pupil of an exposure apparatus that defines two exposure channels separated by a certain distance for application in a patterning method according to an embodiment of the present invention.

In an embodiment of the present invention, the phase change material layer is in a crystalline or polycrystalline state before exposure to the radiation. Desirably the phase change material layer is a crystalline thin film layer. The film may be considered a thermal imaging layer since heat is used to form an image in the film which can then be developed under suitable conditions. Moreover, the film has the property of having substantially no 'memory' of previous partial exposures which do not reach an exposure threshold. The patterning exposure selectively heats the crystalline film and converts the selected regions to an amorphous state. The film is effectively melted locally with high precision, and pooled. In an embodiment, each of the first and second doses of radiation is sufficient to heat the respective first and second portions of the phase change material layer above their respective melting temperatures. The molten regions are then re-solidified into an amorphous state by rapid thermal quenching. In this way, the phase change material acts like a threshold resist, and is therefore eminently suitable for application to double patterning using multi-channel exposing optics, of the type shown in FIG. 1. When the second pattern exposure is made the film has substantially no 'memory' of the first pattern exposure other than the pattern areas where the exposure threshold was exceeded and the crystalline film was converted to an amorphous state. There are therefore little to no proximity effects between the sequentially exposed patterns caused by partial exposure tails on the image. At least one, desirably both, of the first and second portions is exposed with radiation for any appropriate time period to induce the required change in phase of the phase change material. The particular exposure time employed will be a function of various parameters, including the type of radiation source used, the radiation pulse length and the beam power. In an embodiment, at least one, desirably both, of the first and second portions is exposed for a time period of up to around 10 seconds, or selected from the range of around 1 nanosecond to around 10 seconds, or selected from the range of around 50 to 200 nanoseconds, or around 100 nanoseconds.

A further feature of a phase change material which makes it eminently suitable for application in a multi-channel exposing optics system is that the cooling time associated with the thin film pattern area is short, typically about 2 nanoseconds. It is therefore possible to perform patterning in a multi-channel (e.g., two channel) exposure tool employing a plurality of adjacent exposure slits. Each exposure channel may have a complementary pattern, which when sequentially exposed, produces the final composite pattern. By way of example, at a substrate scan speed of 500 mm/second, the time between the first and second exposures would be approximately one million nanoseconds, which is more than enough time for the film to have cooled after the first exposure, even at the highest substrate throughput speed.

The first and second doses of radiation may take any desirable form and may be the same or different to one another. By way of example, each dose of radiation may be the same or different wavelength. Moreover, each dose of radiation may be applied for the same or a different time period. The pattern features resulting from application of the first and second doses of radiation may be substantially the same or different depending upon the wavelength of the radiation used, the time period over which the radiation is applied and/or the structure of the particular pattern to be applied in terms of the size, shape and relative positioning of the pattern features.

A further aspect of the present invention provides a lithographic apparatus, comprising: a substrate holder configured to support a substrate provided with a layer of phase change material; an exposure apparatus configured to expose a first portion of the phase change material layer to a first dose of radiation sufficient to convert the first portion to an amorphous state, and configured to expose a second portion of the phase change material layer, separate from the first portion, to a second dose of radiation sufficient to convert the second portion to an amorphous state; and an etching apparatus configured to remove a portion of the phase change material layer other than the first and second portions such that the first and second portions are substantially intact and define the pattern.

It should be appreciated that a method according to an embodiment of the present invention is not limited to a multi-channel optical system. The double patterning methodology described herein may be implemented using multiple passes through a conventional single illuminator, single channel system. The double patterning methodology described herein may be used with a maskless exposure tool, which, for example, uses tilted mirror assemblies to define the imaging pattern. In an embodiment of the present invention, a double exposure lithography process that employs respective first and second exposures from a single patterning device (e.g., a reticle or maskless patterning device) provides the first and second doses of radiation. In an embodiment, the first and second doses are provided in a single substrate pass by a double exposure scanning lithography process that employs respective first and second exposures from spaced first and second exposure slits. In this embodiment, the first and second exposure slits may be defined in a single patterning device or a plurality of patterning device (e.g. a first reticle defining the first exposure slit and a separate second reticle defining the second exposure slit).

Figure 3A:
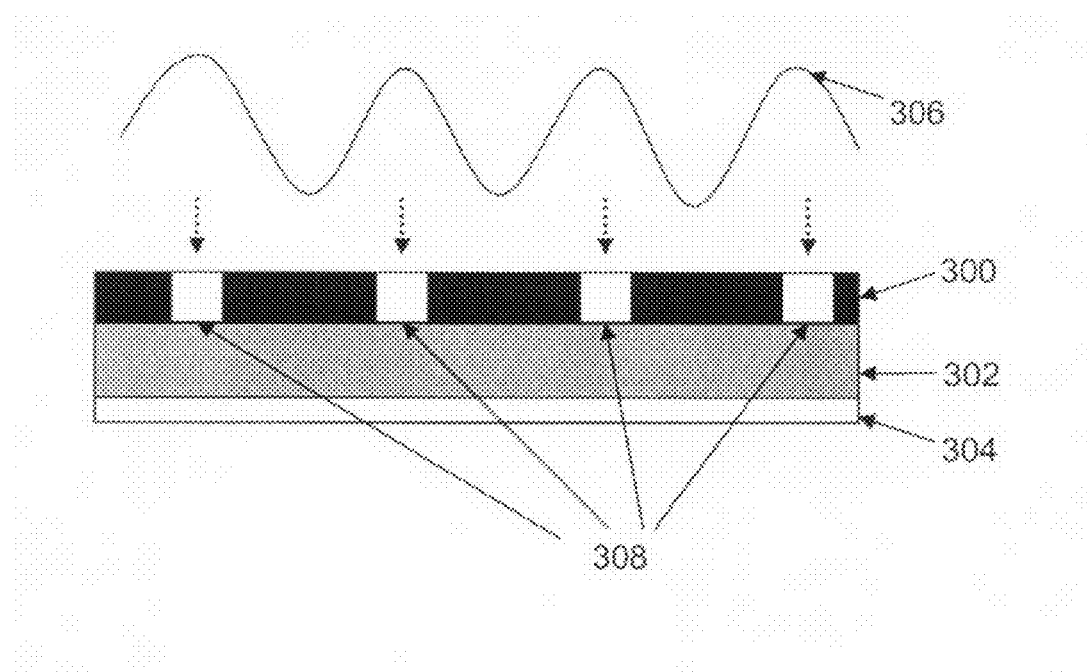
FIGS. 3a to 3d are schematic representations of steps in a pattern transfer method according to an embodiment of the present invention.

An exemplary non-limiting method for pattern transfer according to an embodiment of the present invention is depicted in FIGS. 3a to 3d. In FIG. 3a there is shown a thin film of a phase change material 300, such as but not limited to Ge—Sb—Te alloy or more generally a chalcogenide alloy, provided on a SiO$_2$ layer 302 which is supported on a base 304. The film 300 can be provided by any suitable technique, such as chemical vapor deposition, plasma enhanced chemical vapor deposition, physical vapor deposition, vacuum evaporation, sputter deposition or spin coating. Moreover, the film may be any suitable phase change material and may be in any appropriate state or phase, for example the material may be in a crystalline or polycrystalline state before exposure to radiation.

Figure 3B:
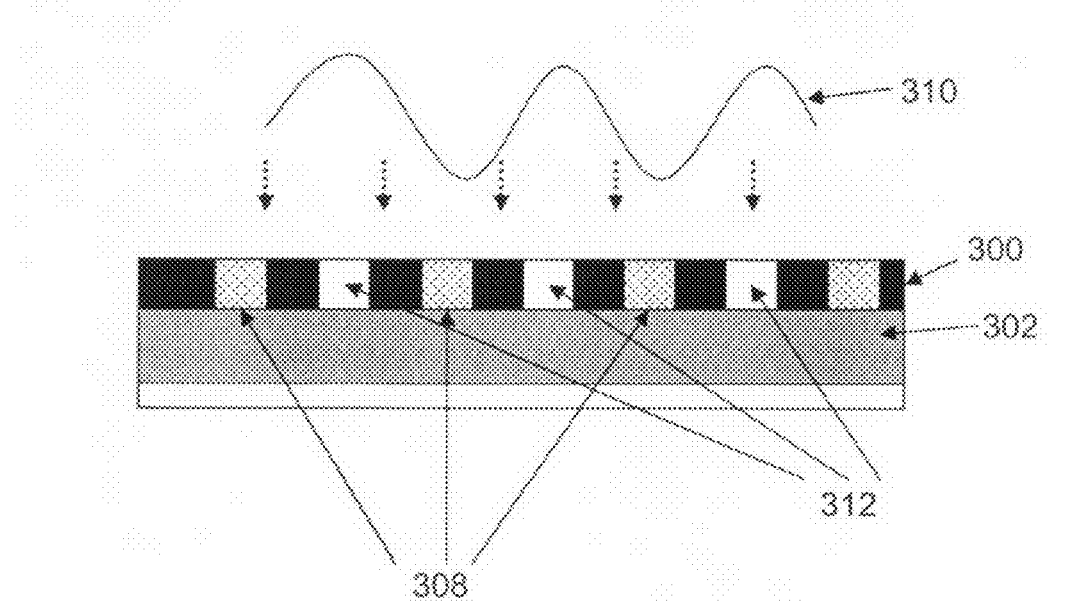

Patterning of the film 300 comprises exposing the film 300 to a first dose of radiation 306, for example extreme ultraviolet (EUV) radiation, X-ray radiation, or radiation having a wavelength of about 126 nm, 157 nm, 193 nm or 248 nm as produced by a source selected from the group consisting of an excimer laser, a continuous wave laser, a plasma discharge and a pulse stretched excimer layer, for any appropriate time period, for example of up to around 10 seconds, selected from around 1 nanosecond to around 10 seconds, selected from around 50 to 200 nanoseconds, or around 100 nanoseconds, to create a first pattern consisting of a first series of amorphous portions 308 in the film 300. This process heats the areas of the film 300 corresponding to the first series of amorphous portions 308 above their melting temperature, which for a Ge—Sb—Te alloy is around 150° C., thereby converting the previously ordered crystalline material to a more disordered amorphous material. The film 300 is then thermally quenched. Thereafter the film 300 is exposed to a second dose of radiation 310, for example extreme ultraviolet (EUV) radiation, X-ray radiation or radiation having a wavelength of about 126 nm, 157 nm, 193 nm, or 248 nm as produced by a source selected from the group consisting of an excimer laser, a continuous wave laser, a plasma discharge and a pulse stretched excimer layer, for a suitable period of time, such as up to around 10 seconds, selected from around 1 nanosecond to around 10 seconds, selected from around 50 to 200 nanoseconds, or around 100 nanoseconds, as shown in FIG. 3b, to create a second pattern consisting of a second series of amorphous portions 312 which are interleaved with the first series of amorphous portions 308. In a similar manner to before, exposing film 300 to radiation of the appropriate wavelength heats selected areas of the film 300 corresponding to the second series of amorphous portions 312 above their melting temperature, thereby providing these areas with sufficient heat energy to convert to an amorphous state. Following exposure to the second dose of radiation 310, the film 300 is thermally quenched once again.

Figure 3C:
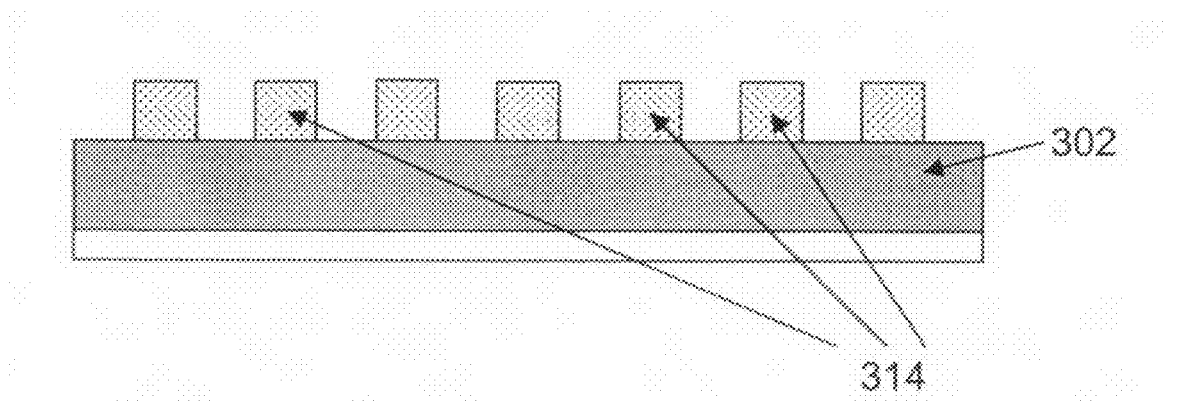
Figure 3D:
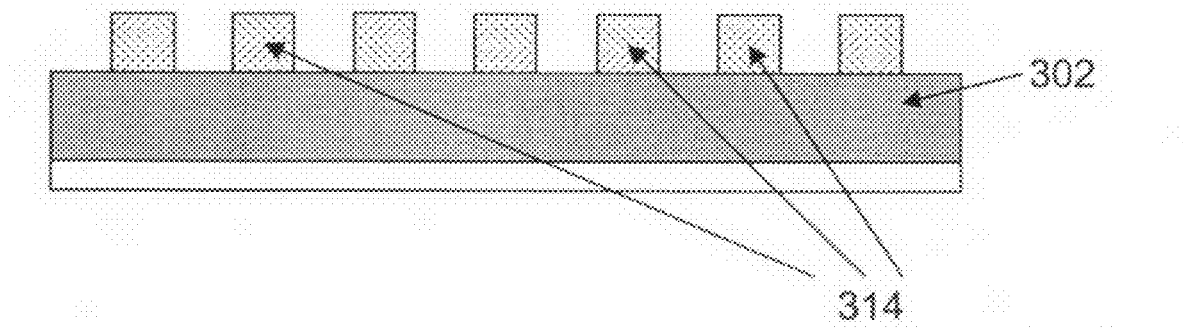

With reference to FIG. 3c, a final pattern 314 in the film 300, consisting of a combination of the first and second series of amorphous portions 308, 312, is formed by selectively removing the unexposed portion of the film 300 to leave the exposed amorphous regions 308, 312 of the film 300. Removal of the portion of the film 300 other than the first and second portions 308, 312 may be accomplished using any suitable process, such as an etching process. The film 300 has the property of being etched at different rates in its unexposed and amorphous states. In an embodiment, the film 300 is etched relatively rapidly in the crystalline state and relatively slowly in the amorphous state. In this way, an unexposed crystalline portion can be etched away relatively quickly while leaving the exposed amorphous portions 308, 312 substantially intact so as to define the final pattern 314. Any appropriate etching process may be employed, for example wet etching using, e.g., an alkaline metal hydroxide developer, such as NaOH solution, or a plasma etching process. In an embodiment, it may be possible to encourage a reaction between the surrounding ambient atmosphere (i.e. gas or fluid) to enhance etch selectivity. While in the melted state, the exposed areas 308, 312 of the film 300 may be sensitive to chemical reaction, for example oxidation. Such chemical reaction may result in a surface of the exposed areas 308, 312 of the film 300 becoming oxidized and thereby more resistant to etching. Consequently, the oxidized surface of the exposed areas 308, 312 may act as an etch inhibition layer to enhance anisotropic etching. A wide range of chemical reagents are available which can be used, under appropriate conditions, to provide an etch inhibition layer, e.g. oxygen, air, water, chlorine, bromine, an oxide of carbon, an oxide of sulfur, a hydrocarbon, etc.

The film 300 may be considered to act essentially as a negative resist. The amorphous portions 308, 312 of the film 300 that define the developed final pattern 314 may be used as a mask in any desirable pattern transfer process, such as an etch mask for an underlying layer of, for example, $SiO_2$ as depicted in FIGS. 3a to 3d. Accordingly, the double exposure process depicted in FIGS. 3a to 3d can be accomplished using only two lithographic exposure steps and a single etch step, which is a significant advance over prior methods which employed two separate resist layer depositions, two resist exposure steps and two etching steps.

An embodiment of a method of the present invention further comprises transferring the pattern into the substrate, for example using any appropriate etch process.

While the embodiment depicted in FIGS. 3a to 3d employed a layer of phase change material deposited (e.g. by spin coating) directly on a $SiO_2$ layer, many other configurations are possible. For example, in an embodiment, the phase change material layer is provided (e.g. by spin coating) on a layer of resist which is deposited directly on a substrate. That is, in an embodiment of the present invention, a layer or resist is provided in between the phase change material layer and the substrate. In this case, a high resolution pattern may be formed first in the phase change material layer as described above, and then transferred to the underlying resist layer before being transferred to the substrate. One or more of the steps of transferring the pattern into the resist and substrate may be achieved by etching using any appropriate conditions.

An embodiment of the present invention provides a device manufacturing method, comprising: exposing a first portion of a phase change material layer provided on a substrate to a first dose of radiation sufficient to convert the first portion to an amorphous state; exposing a second portion of the phase change material layer, separate from the first portion, to a second dose of radiation sufficient to convert the second portion to an amorphous state; removing a portion of the phase change material layer other than the first and second portions such that the first and second portions are substantially intact and define the pattern; and transferring the pattern into the substrate.

An embodiment of the present invention provides a carrier medium carrying computer readable instructions arranged to cause a lithographic apparatus to carry out a method comprising: exposing a first portion of a phase change material layer provided on a substrate to a first dose of radiation sufficient to convert the first portion to an amorphous state; exposing a second portion of the phase change material layer, separate from the first portion, to a second dose of radiation sufficient to convert the second portion to an amorphous state; and removing a portion of the phase change material layer other than the first and second portions such that the first and second portions are substantially intact and define the pattern.

The carrier medium may further carry computer readable instructions to cause the apparatus to etch the pattern in the substrate. The carrier medium may further carry computer readable instructions to cause the first and second doses to be provided by a double exposure lithography process that employs respective first and second exposures from a single patterning device, or a plurality of separate patterning devices.

There are many possible formulations for the phase change material layer. The desired properties of the layer are that a portion of it can be selectively converted from a first, desirably more ordered, crystalline or polycrystalline state to a more disordered, amorphous state by exposure to a patterning illumination and the resulting phase changed material is then selectively etchable to provide a developed image, which may subsequently be used to transfer the pattern into an underlying layer, such as a device processing layer, typically by use of an alkaline metal hydroxide solution or plasma etch.

In an embodiment of the present invention, the phase change material comprises a chalcogenide alloy. The alloy may be any form of multiphase alloy, such as a binary, tertiary or quaternary phase alloy. In addition to the group 16 element present in the chalcogenide alloy, the alloy may further incorporate one or more transition metal elements and/or elements from groups 13, 14 or 15 of the periodic table. Particularly desirable group 16 elements are selected from the group consisting of sulfur, selenium and tantalum. Desirable transition metal elements may be taken from group 5 of the periodic table, such as vanadium, niobium or tantalum and/or group 6 of the periodic table, such as chromium, molybdenum or tungsten. In an embodiment, the phase change material comprises one or more alloys selected from the group consisting of: germanium-antimony-tellurium (Ge—Sb—Te), e.g. Ge—Sb—Te, $GeSb_2Te_4$, or $Ge_2Sb_2Te_5$; tin-antimony-tellurium (Sn—Sb—Te); arsenic-antimony-tellurium (As—Sb—Te); tin-indium-antimony-tellurium (Sn—In—Sb—Te); or arsenic-germanium-antimony-tellurium (As—Ge—Sb—Te). The chalcogenide alloy may incorporate one or more transition metal elements, in combination with one or more group 13, 14 or 15 elements and one or more chalcogens. By way of example, the phase change material may include selenium or tellurium in combination with a group 15 element and a group 5 element, such as vanadium (V—Sb—Te, V—Sb—Se), niobium (Nb—Sb—Te, Nb—Sb—Se) or tantalum (Ta—Sb—Te, Ta—Sb—Se). Moreover, the phase change material may include selenium or tellurium in combination with a group 15 element and a group 6 element, such as chromium (Cr—Sb—Te, Cr—Sb—Se), molybdenum (Mo—Sb—Te, Mo—Sb—Se) or tungsten (W—Sb—Te, W—Sb—Se).

A binary phase change alloy which may be used in a method of the present invention include one or more of Ga—Sb, Sb—Te In—Sb, In—Se, $Sb_2$—$Te_3$ or Ge—Te alloys. A desirable quaternary phase change alloy which may be used include one or more of Ge—Sb—(Se—Te), (Ge—Sn)—Sb—Te, Ag—In—Sb—Te or $Te_{81}$—$Ge_{15}$—$Sb_2$—$S_2$.

The phase change material may be a compound including one or more transition metal elements (e.g. Ag) and/or one or more elements selected from group 13 (e.g. In), 14 (e.g. Ge, Sn), 15 (As, Sb) and/or 16 (e.g. S, Se, Te) of the periodic table.

In further examples, the phase change material may comprise at least one material selected from the group consisting of GST ($Ge_2Sb_2Te_5$), ZnO, $TiO_2$, HfO, NiO, $WO_3$, $Nb_2O_5$, CoO and PCMO($Pr_xCa_{1-x}MnO_3$).

Figure 4:
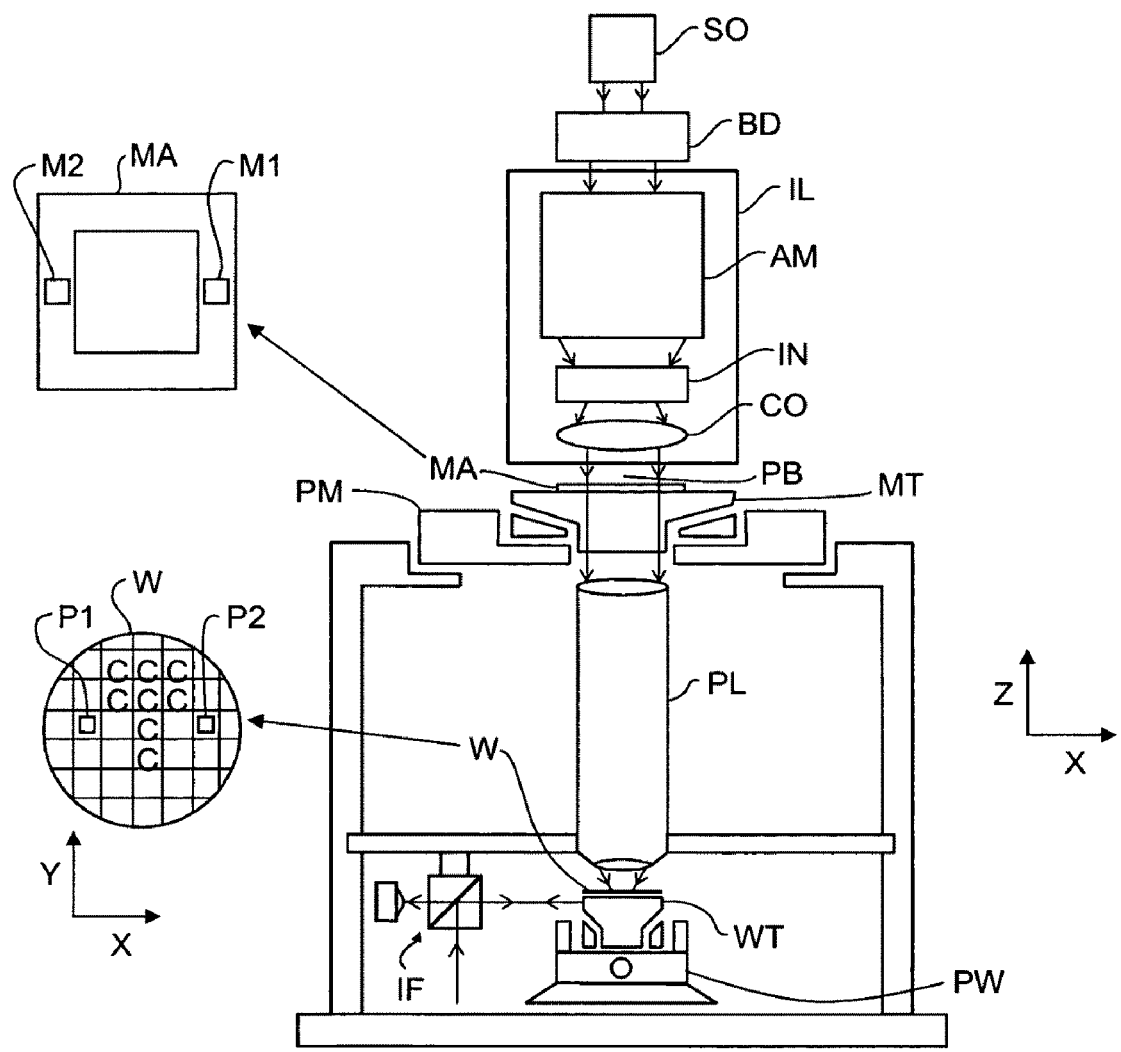
FIG. 4 depicts schematically a lithographic apparatus which can be used in a method according to an embodiment of the present invention.

FIG. 4 schematically depicts a lithographic apparatus which can be used in a method according to a particular embodiment of the invention. The apparatus comprises:

an illumination system (illuminator) IL to condition a beam PB of radiation (e.g. ultraviolet (UV) radiation or deep UV, such as generated by an excimer laser operating at a wavelength of about 193 nm or about 157 nm, or extreme ultra-violet (EUV) radiation, such as generated by a laser-fired plasma source or a discharge plasma source operating at about 13.6 nm);

a support structure (e.g. a reticle table) MT to support a patterning device (e.g. a reticle) MA and connected to first positioning device PM to accurately position the patterning device with respect to item PL;

a substrate table (e.g. a wafer table) WT configured to hold a substrate (e.g. a photoresist-coated wafer) W and connected to second positioning device PW to accurately position the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive reticle). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g. reticle) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 4) can be used to accurately position the patterning device MA with respect to the path of the beam PB, e.g. after mechanical retrieval from a reticle library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed. By way of further example, the depicted apparatus can be used with an interferometric exposure tool, employing either a scanning or stepping mode, operating at extreme ultra-violet (EUV), about 126 nm, about 157 nm, about 193 nm, about 248 nm, or ultraviolet (UV) lamp wavelength.

An embodiment of the invention may be used to form any desirable pattern structures, such as but by no means limited to trenches and lines.

While the lithographic apparatus described above may be used in the manufacture of ICs, it should be understood that the method and apparatus described herein may be applied to the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 1-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include reticles, programmable mirror arrays, and programmable LCD panels. Reticles are well known in lithography, and include reticle types such as binary, alternating phase-shift, and attenuated phase-shift, as well as various hybrid reticle types. An example of a programmable mirror array employs a matrix arrangement of small mirrors, each of which can be individually tilted so as to reflect an incoming radiation beam in different directions; in this manner, the reflected beam is patterned.

The support structure MT holds the patterning device. It holds the patterning device in a way depending on the orientation of the patterning device, the design of the lithographic apparatus, and other conditions, such as for example whether or not the patterning device is held in a vacuum environment. The support structure can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the term "reticle" herein may be considered synonymous with the more general term "patterning device" or synonymous with a mask comprising a pattern for exposure.

The term "projection system" used herein should be broadly interpreted as encompassing various types of projection system, including refractive optical systems, reflective optical systems, catadioptric optical systems, and interference systems for 1D and 2D gratings, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to, collectively or singularly, as a "lens".

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

The pitch, D, corresponding to a feature pitch printable on a substrate for a given patterned radiation beam (for example, a beam passing through a reticle), need not be the minimum feature pitch that is possible from a particular lithography tool. By way of example only, a given 248 nm lithography tool may be capable of printing a minimum feature pitch of 120 nm in a single exposure. If a minimum feature pitch of 100 nm were desired in a substrate, a patterning device (e.g., a reticle) for the lithography tool could be configured for 200 nm minimum feature pitch, and subjected to the double exposure process described above, wherein the desired 100 nm feature pitch could be produced on the substrate. This allows printing of structures whose nominal single exposure minimum pitch is well within tool capabilities, while still fabricating structures of feature pitch below the single exposure minimum feature pitch. It will be appreciated that while this example provided a final feature pitch of D/2, by suitable arrangement of the lithography apparatus, any desirable final feature pitch relative to D, for example, D/3, may be obtained.

In an embodiment of the present invention, the phase change material layer may be subject to a third exposure and, optionally, still further exposures, to form the required pattern of amorphous portions to define the final pattern. As noted herein, the methods described herein may be used in applying more than two exposures. Accordingly, references herein to double patterning or double exposure should be considered as synonymous with multiple patterning or multiple exposure.

The feature spacing, referred to herein by D, is not limited to a feature "pitch" wherein the term pitch denotes a regular spacing between features that is repeated multiple times. The term D can refer to a feature spacing or minimum feature spacing that is characteristic of just one pair of features or a few features, rather than a regular spacing between features that is repeated multiple times.

In addition, although some embodiments disclosed above generally are directed to multiple exposures using a patterned beam or radiation that can have substantially the same pattern in each of the exposures, an embodiment of this invention is possible in which the pattern of the patterned beam of radiation differs between exposures. For example, a first exposure to a patterned beam of radiation might be used to pattern elongated gate features with a spacing D between features, while a second exposure is used to pattern different features, such as squares. The square features of the second exposure might also have a spacing of D which is shifted by D/2 from the gate features. This "heterogeneous" double exposure patterning of a hard mask could be accomplished, for example, using a programmable micromirror array. Thus, features 308 can be different in size and/or shape to features 312.

Figure 5:
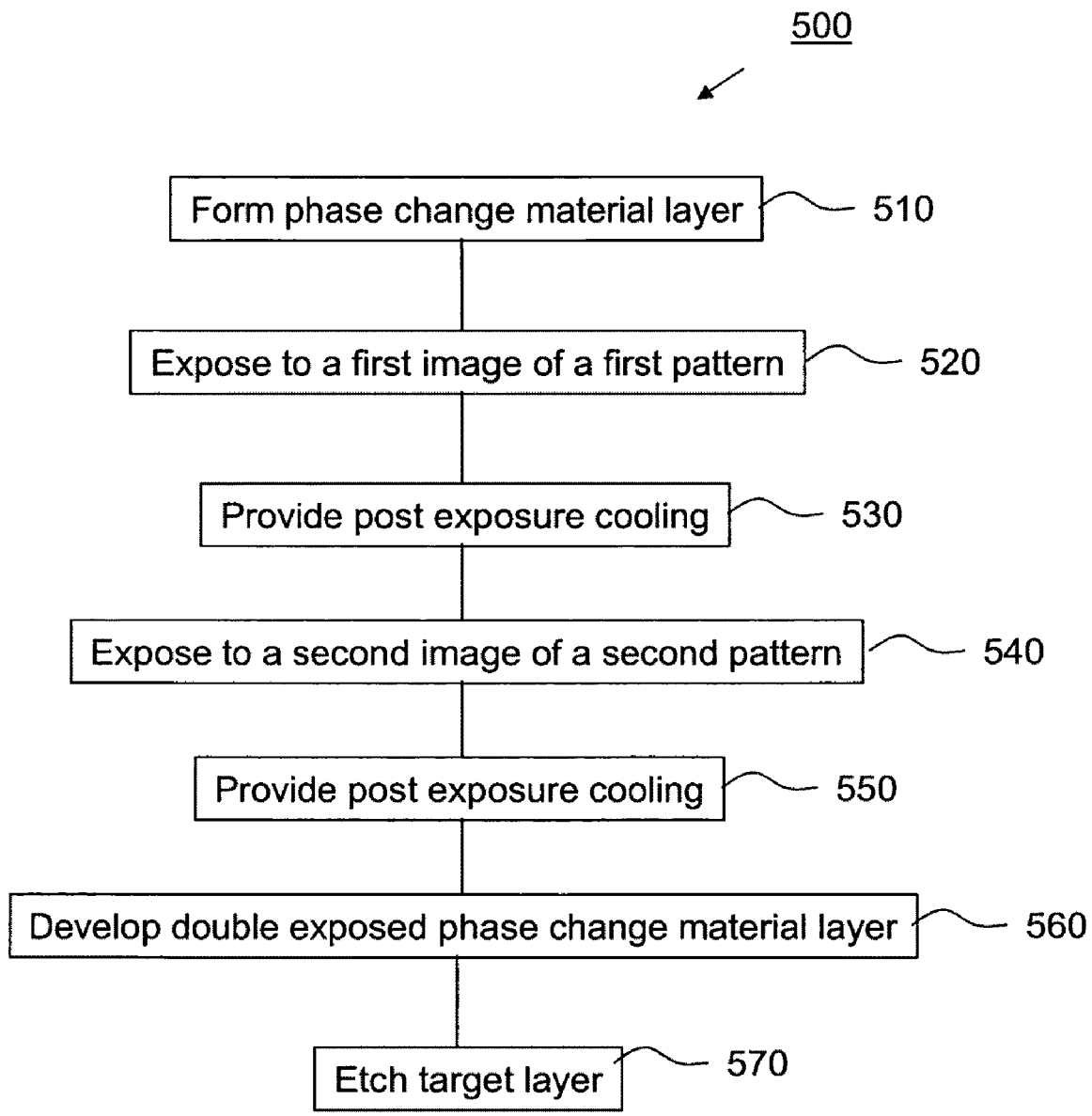
FIG. 5 is a flow diagram representing steps in a double patterning lithography technique in accordance with an embodiment of the present invention.

Referring now to FIG. 5 there is shown a series of steps 500 which together define an embodiment of the double patterning lithography technique according to the present invention. A layer of a phase change material (e.g. the thin film layer 300 in FIGS. 3a to 3d) is first deposited on a suitable substrate layer (e.g. the $SiO_2$ layer 302 in FIGS. 3a to 3d) using any convenient technique 510, such as any one or more of the techniques described in more detail above in relation to FIGS. 3a to 3d. The layer of phase change material is then exposed to a first image of a first pattern 520 by a first dose of radiation (e.g. the first dose of radiation 306 in FIGS. 3a to 3d) of any suitable wavelength for an appropriate period of time so as to form an amorphous portion in the exposed regions of the phase change material layer. The layer is then subjected to post-exposure cooling 530 to thermally quench the layer and 'lock-in' the amorphous portion within the layer. The layer is then exposed to a second image of a second pattern using a second dose of radiation 540 (e.g. the second dose of radiation 310 in FIGS. 3a to 3d) again of any appropriate wavelength and for any suitable period of time, thereby forming a further amorphous portion corresponding to the regions of the layer exposed to the second dose of radiation. The phase change material is then subjected to a second post-exposure cooling step 550 to thermally quench the layer. The first and second patterns are designed so as to interleave one another and thereby define a final high resolution pattern in the phase change material layer. The double exposed phase change material layer is then developed 560 so as to selectively remove the unexposed crystalline portion of the layer and leave the exposed amorphous regions. Subsequently, the final pattern may be etched 570, using any suitable etching process, into the underlying substrate layer.

The above methods and systems may be used in conjunction with any patterning level employed in patterning a substrate using a patterned beam of radiation. For example, the patterning level could be a metal level or alternatively, a gate level. Moreover, it will be appreciated that each different patterning level can be associated with a different minimum substrate pitch D. The use of the threshold resist type phase change material allows the use of a double patterning technique which extends the resolution capability of optical lithography. An embodiment of the present invention facilitates sub-32 nm node (half pitch) resolution, for example 16 nm half pitch resolution may be achievable with superior pattern to pattern registration. The use of the phase change material with double channel optics allows resolution enhancing double patterning without loss of scanner throughput, thereby providing a significant productivity improvement. On a two channel optics system, alignment of the first and second patterns may be carried out at the patterning device stage at 4× magnification thereby providing a significant overlay improvement and effectively 'locking' the two patterns together. The enabling of two exposure channels gives double the available exposure dose (two lasers and illuminators).

While specific embodiments of the invention have been described above, it will be appreciated that the invention may be practiced otherwise than as described. The description is not intended to limit the invention.

The invention claimed is:

1. A method for pattern transfer, comprising:
   exposing a first portion of a phase change material layer provided on a substrate to a first dose of radiation sufficient to convert the first portion to an amorphous state;
   subsequently exposing a second portion of the phase change material layer, separate from the first portion and in between parts of the first portion, to a second dose of radiation sufficient to convert the second portion to an amorphous state; and
   removing a portion of the phase change material layer other than the first and second portions such that the first and second portions are substantially intact and define a pattern with about 32 nm or less half pitch resolution.

2. The method of claim 1, wherein the phase change material layer is in a crystalline or polycrystalline state before exposure to the radiation.

3. The method of claim 1, wherein the phase change material layer comprises a chalcogenide alloy.

4. The method of claim 1 wherein the phase change material layer comprises an alloy selected from the group consisting of Sb-Te, $Ge_2$-$Sb_2$-$Te_5$, Ge-$Sb_2$-$Te_4$, and Ge-Sb-Te.

5. The method of claim 1, wherein the phase change material layer is provided by a process selected from the group consisting of chemical vapor deposition, plasma enhanced chemical vapor deposition, physical vapor deposition, sputter deposition, vacuum deposition and spin coating.

6. The method of claim 1, wherein each of the first and second doses of radiation is sufficient to heat the respective first and second portions of the phase change material layer above their respective melting temperatures.

7. The method of claim 1, wherein the first portion, or the second portion, or both the first and second portions, is exposed for a time period of up to around 10 seconds.

8. The method of claim 1, wherein the first portion, or the second portion, or both the first and second portions, is exposed for a time period of around 100 nanoseconds.

9. The method of claim 1, wherein the first dose or radiation, or the second dose of radiation, or both the first and second doses of radiation, comprises extreme ultra-violet (EUV) radiation, X-ray radiation, or radiation possessing a wavelength selected from the group consisting of 126 nm, 157 nm, 193 nm and 248 nm.

10. The method of claim 1, wherein the first dose of radiation, or the second dose of radiation, or both the first and second doses of radiation, is generated from a source selected from the group consisting of an excimer laser, a continuous wave laser, a plasma discharge and a pulse stretched excimer laser.

11. The method of claim 1, wherein the first and second doses of radiation are substantially the same.

12. The method of claim 1, wherein features of the first portion of the phase change material layer differ from features of the second portion of the phase change material layer.

13. The method of claim 1, wherein removal of the portion of the phase change material layer other than the first and second portions employs an etching process.

14. The method of claim 13, wherein the etching process employs an alkaline metal hydroxide solution or a plasma.

15. The method of claim 1, further comprising etching the pattern into the substrate.

16. The method of claim 1, wherein a layer of resist is provided in between the phase change material layer and the substrate.

17. The method of claim 16, further comprising forming the pattern in the layer of resist.

18. The method of claim 17, further comprising etching the pattern in the substrate.

19. The method of claim 1, wherein the first and second doses are provided by a double exposure lithography process that employs respective first and second exposures from a single patterning device.

20. The method of claim 1, wherein the first and second doses are provided in a single substrate pass by a double exposure scanning lithography process that employs respective first and second exposures from spaced first and second exposure slits.

21. The method of claim 20, wherein the first and second exposure slits are defined by a single patterning device.

22. The method of claim 20, wherein the first exposure slit is defined by a first patterning device and the second exposure slit is defined by a separate second patterning device.

23. A lithographic apparatus, comprising:
a substrate holder configured to hold a substrate provided with a layer of phase change material;
an exposure apparatus configured to expose a first portion of the phase change material layer to a first dose of radiation sufficient to convert the first portion to an amorphous state, and configured to subsequently expose a second portion of the phase change material layer, separate from the first portion and in between parts of the first portion, to a second dose of radiation sufficient to convert the second portion to an amorphous state; and
an etching apparatus configured to remove a portion of the phase change material layer other than the first and second portions such that the first and second portions are substantially intact and define a pattern with about 32 nm or less half pitch resolution.

24. The lithographic apparatus of claim 23, wherein the phase change material layer is in a crystalline or polycrystalline state before exposure to the radiation.

25. The lithographic apparatus of claim 23, wherein the phase change material layer comprises a chalcogenide alloy.

26. The lithographic apparatus of claim 23, configured to expose the first portion, or the second portion, or both the first and second portions, for a time period of up to around 10 seconds.

27. The lithographic apparatus of claim 23, wherein the etching apparatus is configured to remove the portion of the phase change material layer other than the first and second portions using an alkaline metal hydroxide solution or a plasma.

28. The lithographic apparatus of claim 23, configured to provide the first and second doses from respective first and second exposures from a single patterning device.

29. The lithographic apparatus of claim 23, configured to provide the first and second doses in a single substrate pass from respective first and second exposures from spaced first and second exposure slits.

30. The lithographic apparatus of claim 29, wherein the first and second exposure slits are defined by a single patterning device.

31. The lithographic apparatus of claim 29, wherein the first exposure slit is defined by a first patterning device and the second exposure slit is defined by a separate second patterning device.

32. A device manufacturing method, comprising:
exposing a first portion of a phase change material layer provided on a substrate to a first dose of radiation sufficient to convert the first portion to an amorphous state;
subsequently exposing a second portion of the phase change material layer, separate from the first portion and in between parts of the first portion, to a second dose of radiation sufficient to convert the second portion to an amorphous state;
removing a portion of the phase change material layer other than the first and second portions such that the first and second portions are substantially intact and define the pattern with about 32 nm or less half pitch resolution; and
transferring the pattern into the substrate.

33. The method of claim 32, wherein the phase change material layer is in a crystalline or polycrystalline state before exposure to the radiation.

34. The method of claim 33, wherein the phase change material layer comprises a chalcogenide alloy.

35. A non-transitory carrier medium carrying computer readable instructions arranged to cause a lithographic apparatus to carry out a method comprising:
exposing a first portion of a phase change material layer provided on a substrate to a first dose of radiation sufficient to convert the first portion to an amorphous state;
subsequently exposing a second portion of the phase change material layer, separate from the first portion and in between parts of the first portion, to a second dose of radiation sufficient to convert the second portion to an amorphous state; and
removing a portion of the phase change material layer other than the first and second portions such that the first and second portions are substantially intact and define a pattern with about 32 nm or less half pitch resolution.

36. The carrier medium of claim 35, further carrying computer readable instructions to cause the apparatus to etch the pattern in the substrate.

37. The carrier medium of claim 35, further carrying computer readable instructions to cause the first and second doses to be provided by a double exposure lithography process that employs respective first and second exposures from a single patterning device.

38. The carrier medium of claim 35, further carrying computer readable instructions to cause the first and second doses to be provided in a single substrate pass by a double exposure scanning lithography process that employs respective first and second exposures from spaced first and second exposure slits.

* * * * *